(12) United States Patent
Cahill et al.

(10) Patent No.: US 8,670,470 B2
(45) Date of Patent: Mar. 11, 2014

(54) TUNABLE LASER

(75) Inventors: Michael Cahill, Dedham, MA (US); Rong Sun, Cambridge, MA (US)

(73) Assignee: Photop Aegis, Inc., Woburn, MA (US)

( * ) Notice: Subject to any disclaimer, the term of this patent is extended or adjusted under 35 U.S.C. 154(b) by 0 days.

(21) Appl. No.: 13/372,549

(22) Filed: Feb. 14, 2012

(65) Prior Publication Data
US 2012/0219023 A1     Aug. 30, 2012

Related U.S. Application Data

(60) Provisional application No. 61/446,514, filed on Feb. 25, 2011.

(51) Int. Cl.
*H01S 3/10* (2006.01)

(52) U.S. Cl.
USPC .......................................................... 372/20

(58) Field of Classification Search
USPC .................. 372/20; 398/48; 359/579, 578
See application file for complete search history.

(56) References Cited

U.S. PATENT DOCUMENTS

2005/0123008 A1*   6/2005   Daiber et al. ................... 372/20

* cited by examiner

*Primary Examiner* — Jessica Stultz
*Assistant Examiner* — Tuan Nguyen
(74) *Attorney, Agent, or Firm* — Kurt Rauschenbach; Rauschenbach Patent Law Group, LLC

(57) ABSTRACT

A tunable laser includes an optical cavity comprising a first and second mirror. A gain medium is positioned in the optical cavity that generates stimulated emission in the optical cavity when biased. A thermally tunable optical filter is positioned in the optical cavity that is heated to a temperature that selects a desired optical mode of the optical cavity. A thermally tunable optical phase retarder is positioned in the optical cavity that is heated to a temperature which changes an optical path length in the optical cavity by an amount corresponding to a resonant frequency of the tunable optical filter so that a phase-matching condition of the optical cavity is shifted to the desired optical mode of the optical cavity selected by the thermally tunable optical filter.

24 Claims, 7 Drawing Sheets

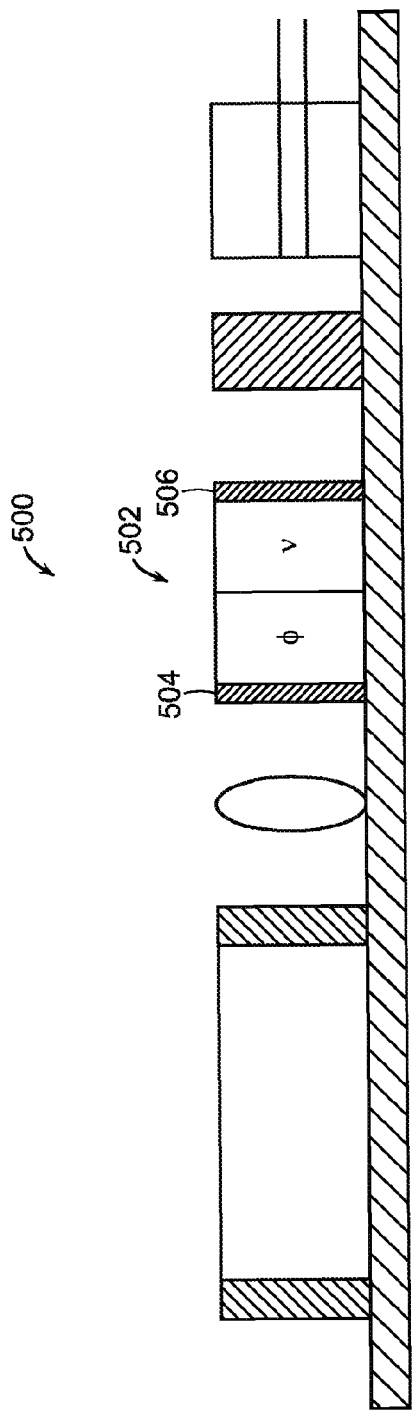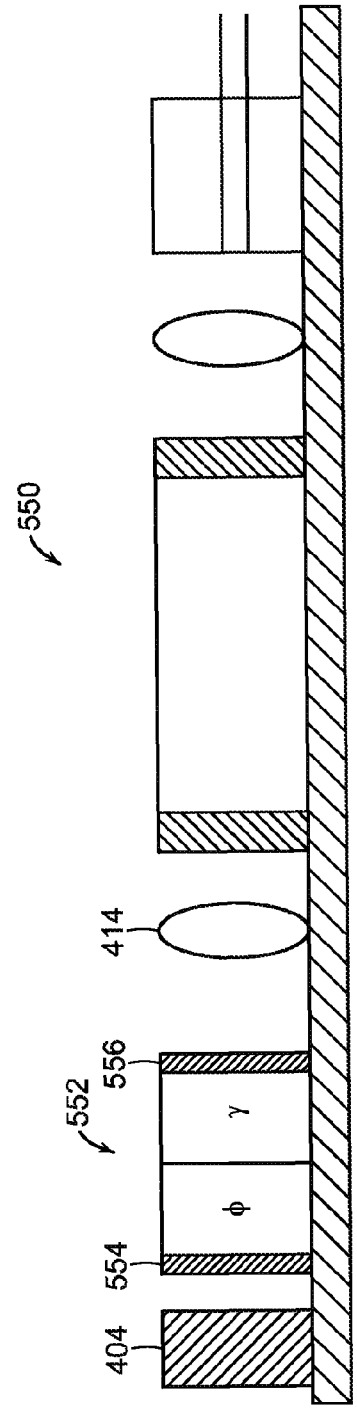

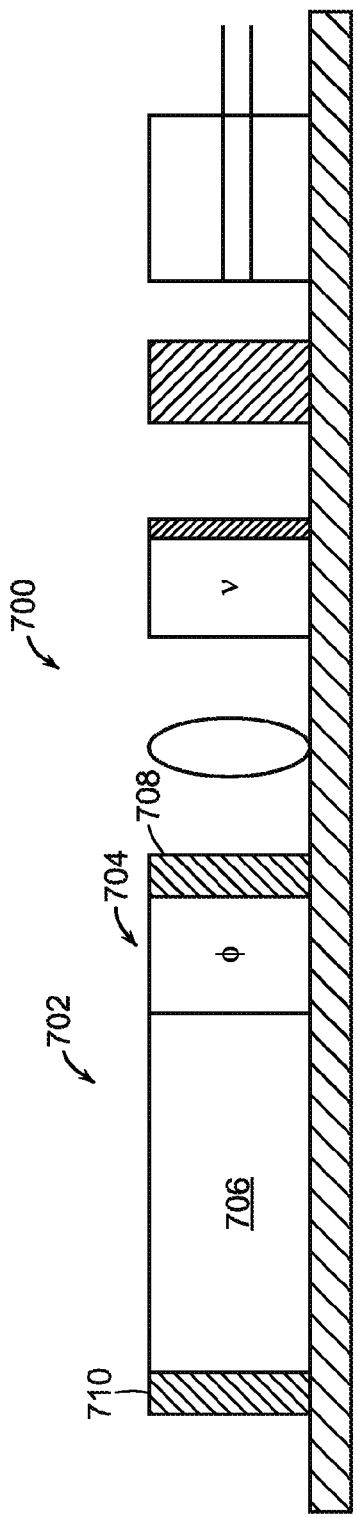
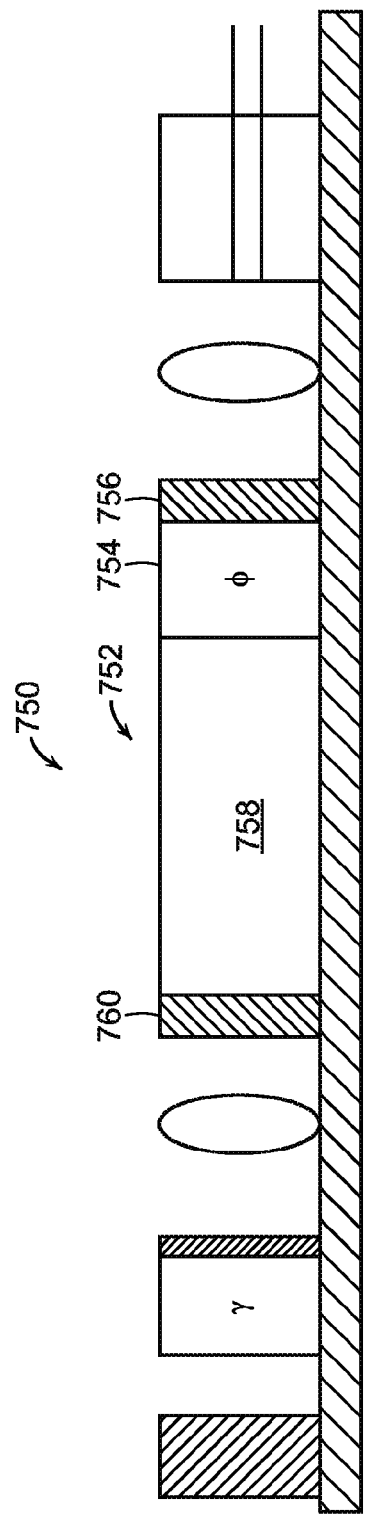
FIG. 7A
FIG. 7B

TUNABLE LASER

CROSS-REFERENCE TO RELATED APPLICATIONS

The present application is a non-provisional of copending U.S. Provisional Patent Application Ser. No. 61/446,514, filed on Feb. 25, 2011. The entire contents U.S. Patent Application Ser. No. 61/446,514 is herein incorporated by reference.

The section headings used herein are for organizational purposes only and should not to be construed as limiting the subject matter described in the present application in any way.

INTRODUCTION

Tunable lasers are widely used in transponders for state-of-the art optical telecommunication systems. Full-band tunable lasers enable transponders to be used at any wavelength in the C- or L-bands, thus reducing inventory sparing, and enabling wavelength agility of transmitter nodes. Tunable lasers are also used for coherent transmission, which is used by many 40 G and all 100 G (and above) transponders.

Early tunable lasers used bulky free-space optical components that were difficult to align. These tunable lasers also had relatively low optical powers. Recently, integrated tunable lasers have been fabricated and coupled with MEMS mirrors to form full-band tunable lasers. However, these tunable lasers are relatively large because it takes significant space to align the MEMS mirrors. Other tunable lasers include a cascade of discrete filters that create Vernier responses where the net wavelength tunability is much greater than the individual device tunability. However, these tunable filters have both alignment and control challenges that prevent them from being widely used.

BRIEF DESCRIPTION OF THE DRAWINGS

The applicants' teachings, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teachings. The drawings are not intended to limit the scope of the applicant's teachings in any way.

FIG. 5A illustrates an embodiment of the tunable laser according to the present teaching that is similar to the tunable laser described in connection with FIG. 1 but that includes an integrated frequency selective device and optical phase retarder.

FIG. 5B illustrates an embodiment of the tunable laser according to the present teaching that is similar to the tunable laser described in connection with FIG. 4 but that includes an integrated frequency selective device and optical phase retarder.

FIG. 7A illustrates another embodiment of the tunable laser according to the present teaching that is similar to the tunable laser described in connection with FIG. 1 but that includes an integrated gain medium and optical phase retarder in a single laser facet configuration.

FIG. 7B illustrates another embodiment of the tunable laser according to the present teaching that is similar to the tunable laser described in connection with FIG. 4 but that includes an integrated gain medium and optical phase retarder in a dual laser facet configuration.

DESCRIPTION OF VARIOUS EMBODIMENTS

Figure 1:
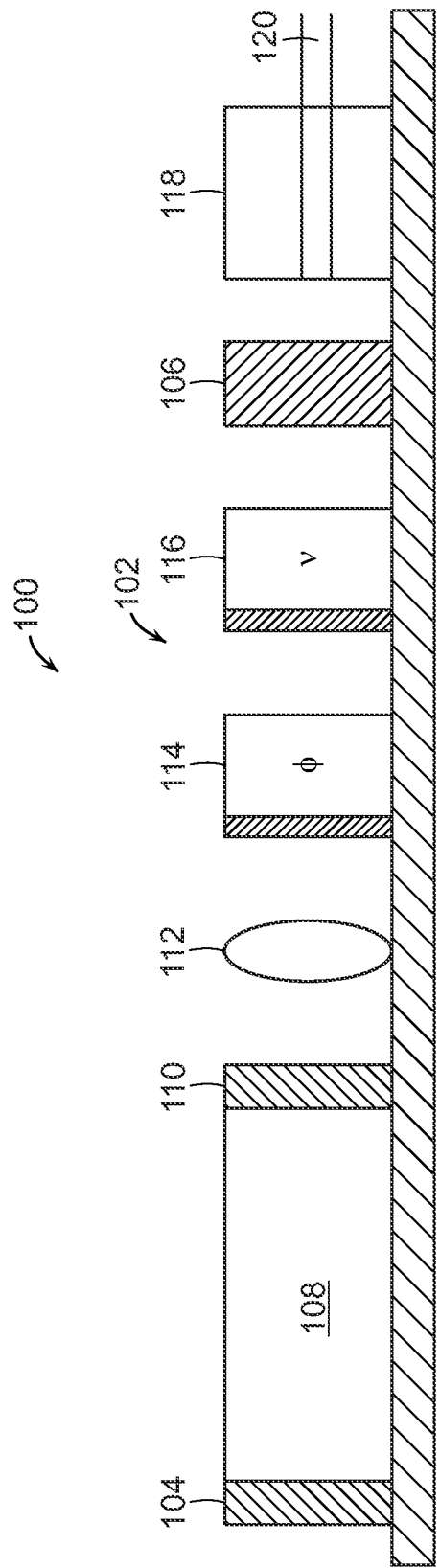
FIG. 1 illustrates one embodiment of a tunable laser according to the present invention.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the applicants' teachings may be performed in any order and/or simultaneously as long as the teachings remain operable. Furthermore, it should be understood that the apparatus and methods of the applicants' teachings can include any number or all of the described embodiments as long as the teachings remain operable.

The applicants' teachings will now be described in more detail with reference to exemplary embodiments thereof as shown in the accompanying drawings. While the applicants' teachings are described in conjunction with various embodiments and examples, it is not intended that the applicants' teachings be limited to such embodiments. On the contrary, the applicants' teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching relates to tunable lasers that use a frequency-selective and a phase-controlling feedback mechanism in various configurations. The present teaching is described in connection with a tunable laser comprising a semiconductor gain medium having a laser facet that forms one end of an optical cavity and a mirror at the other end of the optical cavity. It should be understood that the tunable laser of the present teaching is not limited to tunable lasers with semiconductor gain medium. Any type of gain medium can be used with the tunable laser of the present teaching. In addition, it should be understood that the tunable laser of the present teaching is not limited to tunable lasers with optical cavities formed by a laser facet. Any type of mirrors can be used with the tunable laser of the present teaching.

In one embodiment, the tunable laser according to the present teaching includes a semiconductor gain medium, a thermally tunable frequency selector, and a thermally tunable phase retarder in an external cavity configuration. The thermally controlled frequency selector is a single element that can tune across an entire optical transmission communication band, or a subset thereof, such as the C- or L-bands. The thermally tunable optical phase retarder is a material that changes its optical path length with temperature. The thermally tunable frequency selector and the thermally tunable phase retarder can each have integrated resistive heaters. Many embodiments of the thermally tunable frequency selector and the thermally tunable phase retarder are relatively small in size and can be manufactured in large volume with high yield using well known semiconductor processes.

In various embodiments, the temperature controlled frequency selector and the temperature controlled phase retarder are integrated together in one single element. Also, the temperature controlled phase retarder can be integrated with one or both of the laser mirrors. In addition, the temperature controlled phase retarder can be integrated with the semiconductor gain media.

FIG. 1 illustrates one embodiment of a tunable laser 100 according to the present invention. The tunable laser 100 is configured as a frequency-selective external optical cavity 102 that includes a high-reflectivity mirror 104 forming one end of the optical cavity 102 and a partially reflecting mirror forming a laser facet 106 on the other end of the optical cavity 102. One feature of the embodiment of the tunable laser 100 shown in FIG. 1 is that using a single partially reflecting laser facet 106 provides for relatively easy alignment of the optical components. The tunable laser 100 shown in FIG. 1 is formed of discrete optical components. However, one skilled in the art will appreciate tunable lasers according to the present teaching can be fabricated in various configurations and by various means to construct a tunable laser that is fully integrated, partially integrated with some discrete components and some integrated components, or formed of all discrete devices.

The tunable laser 100 includes a semiconductor gain medium 108. One skilled in the art will appreciate that numerous other types of optical gain medium can also be used. An output of a current source is electrically connected to the semiconductor gain medium 108 to provide power for generating the optical gain. In one configuration according to the present teaching, the semiconductor gain medium 108 includes the high-reflectivity mirror 104 on a first end surface which forms one end of the optical cavity 102. The second end surface of the semiconductor gain medium 108 has an antireflection coating 110 for passing the optical beam in both directions without being reflected into and out of the cavity 102. In some embodiments, a collimating lens 112 is positioned adjacent to the optical gain medium 108 to focus the optical beam into and out of the semiconductor gain medium 108.

An optical phase retarder 114 is positioned adjacent to the collimating lens 112. In one embodiment, the optical phase retarder 114 is a temperature controlled phase retarder 114, such as a thermally-tunable phase retarder. For example, the thermally-tunable phase retarder 114 can be a silicon chip positioned proximate to or in contact with a heater. Various types of heaters can be used with the optical phase retarder 114 of the present teaching. For example, the heater can be a resistive heater integrated into the phase retarder 114 or in close proximity. In some embodiments of the present teaching, the optical phase retarder 114 is a discrete element. In other embodiments, the optical phase retarder 114 is integrated with a frequency selective device. In yet other embodiments, the optical phase retarder 114 is integrated with the gain medium 108. The optical phase retarder 114 is used to adjust the cavity mode so that the cavity mode lines up directly with the desired optical frequency.

A frequency selective device 116, such as an optical filter, is positioned adjacent to the optical phase retarder 114. In one embodiment, the frequency selective device 116 is a thermally tunable optical filter. For example, the frequency selective device 116 can be a thermally tunable Fabry-Perot optical filter that includes a single crystalline sheet resistance heater layer, a thin single crystalline (c-Si) silicon spacer layer (and numerous other types of spacer layers), and distributed Bragg reflectors having layers of dielectric materials. Such a device is described in connection with FIGS. 3A and 3B and is also described in more detailed in U.S. patent application Ser. No. 13/154,262, filed Jun. 6, 2011, and entitled "Thermally Tunable Optical Filter With Single Crystalline Spacer Fabricated By Fusion Bonding," which claims priority to U.S. Provisional Patent Application Ser. No. 61/352,238, filed Jun. 7, 2010 and entitled "Tunable Optical Filter with Single-Crystalline Silicon Spacer," which are both assigned to the present assignee.

The optical phase retarder 114 and the frequency selective device 116 can be integrated in many different ways. For example, the optical phase retarder 114 and the frequency selective device 116 can comprise an integrated temperature controlled phase retarder and thermally tunable optical filter. In various embodiments, the frequency selective device 116 and the optical phase retarder 114 can be position anywhere in the optical cavity. For example, the frequency selective device 116 can be positioned adjacent to the collimating lens 112 and the optical phase retarder 114 can be positioned adjacent to the laser facet 106.

The partially reflecting mirror or laser facet 106 is positioned adjacent to the frequency selective device 116 in the optical path. The reflectivity of the laser facet 106 is chosen to provide the desired feedback into the optical cavity 102. An optical fiber collimating lens 118 is positioned adjacent to the laser facet 106. An input of an optical fiber 120 is positioned at the output of the collimating lens 118.

The elements of the tunable laser according to the present invention need to be accurately aligned in order to maximize the performance of the layer. Accurate alignment of the external cavity elements comprising the tunable laser 100 is important to ensure high coupling efficiency of light into and out of the gain medium 108 and into the optical fiber 120. Also, accurate alignment of the external cavity elements is important to maximize tuning efficiency of the frequency selective device 116 and the efficiency of the optical phase retarder 114. In addition, accurate alignment of the external cavity elements is important to minimize back-reflection causing undesired cavity resonances.

A method of operating the tunable laser 100 described in connection with FIG. 1 where both the optical phase retarder 114 and the frequency selective device 116 are thermally tunable is as follows. Current is applied to the gain media 108 so as to cause the tunable laser 100 to generate stimulated emission between the high-reflectivity mirror 104 and the partially-reflecting laser facet 106. The frequency-selective external optical cavity 102 can support many optical modes that meet the phase-matching condition. One or more of these optical modes is selected by adjusting the tunable optical filter 116. The tunable optical filter 116 is tuned in frequency by applying current to a resistive heater positioned proximate to or integrated with the tunable optical filter 116. In some embodiments, the resonant frequency of the tunable optical filter 116 is determined by calibrating the measured resonant frequency with the corresponding device temperature. The resonant frequency measurements can be made with a spectrometer. The temperature measurements can be made with a thermistor or other type of temperature sensor. A stand-alone thermistor can be positioned in thermal contact with the tunable optical filter 116. Alternatively, a thermistor can be fabricated directly on the tunable optical filter 116, which can provide a more accurate measurement of the local device temperature.

The optical phase retarder 114 provides a small change in the optical path length of the optical cavity 102 of more than one-half of a wavelength in each direction of propagation, where the wavelength corresponds to the resonant frequency of the tunable optical filter 116. The change in path length is impressed on the cavity by changing the temperature of the optical phase retarder 114, which changes the refractive index of the optical material comprising the phase retarder or other device. The change in optical path length corresponds to a phase retardation of up to two pi radians so that the phase-matching condition of the optical cavity 102 is shifted from one cavity mode to the next cavity mode. However, in practice, a phase retardation greater than two pi radians may be required.

Figure 2A:
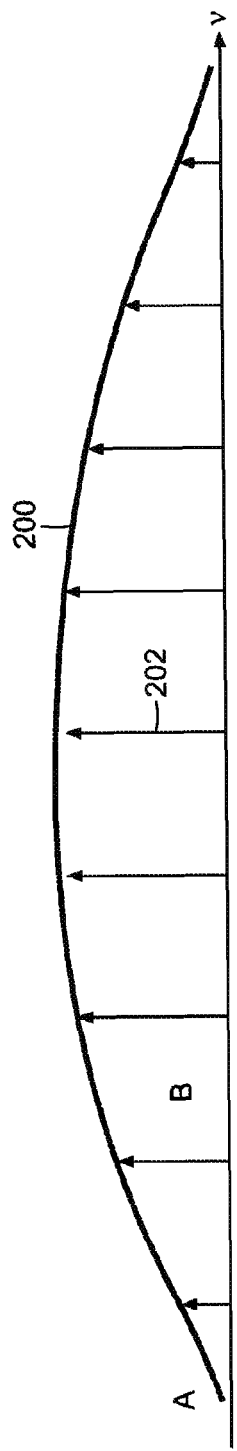
FIG. 2A illustrates a gain profile of the optical gain medium used in tunable lasers according to the present teaching with the optical cavity modes superimposed onto the gain profile.
Figure 2B:
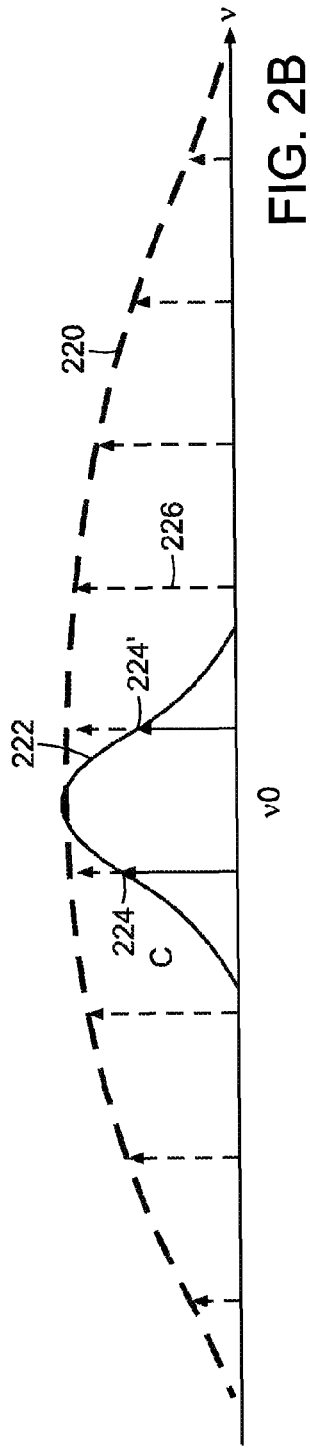
FIG. 2B illustrates a gain profile as a function of frequency and a filter response of a tunable optical filter used in the tunable lasers according to the present teaching as a function of time showing cavity modes of the filter relative to the other cavity modes.
Figure 2C:
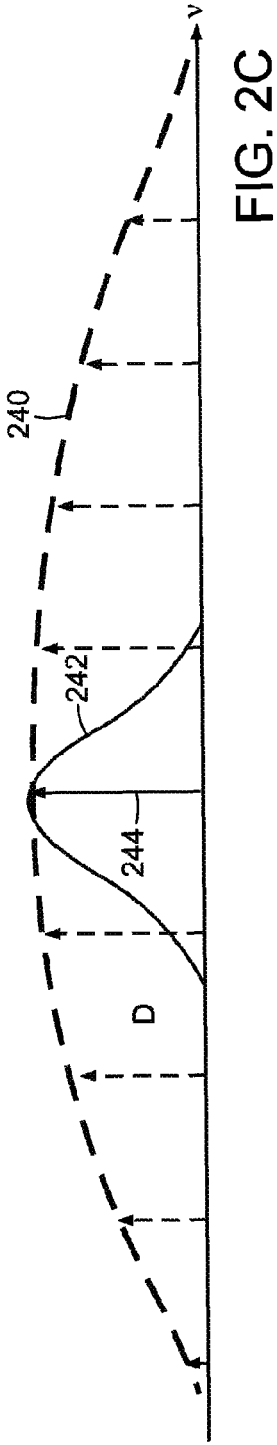
FIG. 2C illustrates a gain profile as a function of frequency and a filter response of a tunable optical filter used in the tunable lasers according to the present teaching as a function of time showing the alignment of one specific cavity mode to the center frequency of the tunable filter response.

FIGS. 2A-2C illustrates the operation of the tunable laser described in connection with FIG. 1. FIG. 2A illustrates a gain profile 200 of the optical gain medium used in tunable lasers according to the present teaching with the optical cavity modes 202 superimposed onto the gain profile 200. In particular, FIG. 2A illustrates the gain of a semiconductor amplifier suitable for use with tunable lasers according to the present teaching as a function of frequency with the optical cavity modes 202 superimposed onto the gain profile 200 as a function of frequency.

FIG. 2B illustrates a gain profile 220 as a function of frequency and a filter response 222 of a tunable optical filter used in the tunable lasers according to the present teaching as a function of time showing cavity modes 224 and 224' of the filter relative to the other cavity modes 226. FIG. 2B shows that there are two cavity modes 224, 224' inside the filter response 222. The center frequency of the tunable optical filter is chosen by adjusting the temperature of the tunable optical filter.

FIG. 2C illustrates a gain profile 240 as a function of frequency and a filter response 242 of a tunable optical filter used in the tunable lasers according to the present teaching as a function of time showing the alignment of one specific cavity mode 244 to the center frequency of the tunable filter response. The alignment is achieved by adjusting the temperature of the temperature controlled phase retarder in the tunable laser.

Figure 3A:
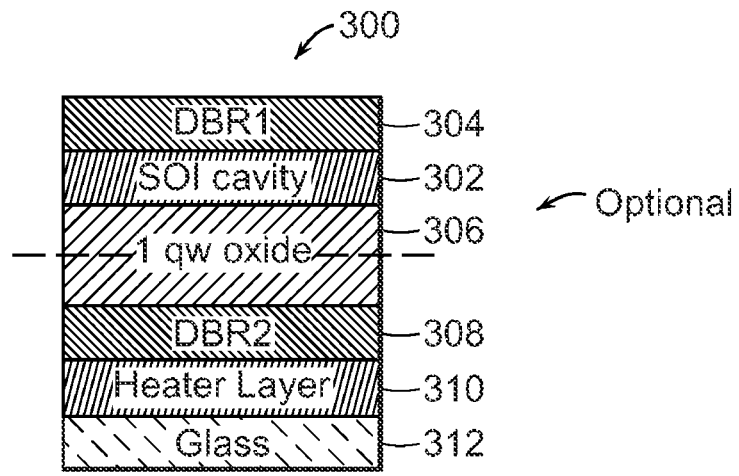
FIG. 3A illustrates one embodiment of a thermally tunable Fabry-Perot optical filter that can be used in the tunable laser of the present teaching.

FIG. 3A illustrates one embodiment of a thermally tunable Fabry-Perot optical filter 300 that can be used in the tunable laser of the present teaching. In one embodiment, the tunable optical filter 300 includes a single-crystalline silicon cavity 302. However, one skilled in the art will appreciate that numerous types of Fabry-Perot cavities can be used. For example, the tunable optical filter 300 can include an amorphous silicon or various III-IV semiconductor material Fabry-Perot cavities. A first distributed Bragg reflector 304 is formed on a top surface of the single-crystalline silicon cavity 302. In some embodiments, a quarter-wavelength oxide layer 306 is formed on the bottom surface of the single-crystalline silicon cavity 302 by fusion bonding the two halves of the tunable optical filter 300. A second distributed Bragg reflector 308 is formed on the bottom surface of the optional quarter wavelength oxide layer 306. A single crystalline heater 310 is formed on the bottom of the second distributed Bragg reflector 308. An electrical contact is made to the crystalline heater 310. A glass substrate 312 is bonded to the single crystalline heater 310.

Figure 3B:
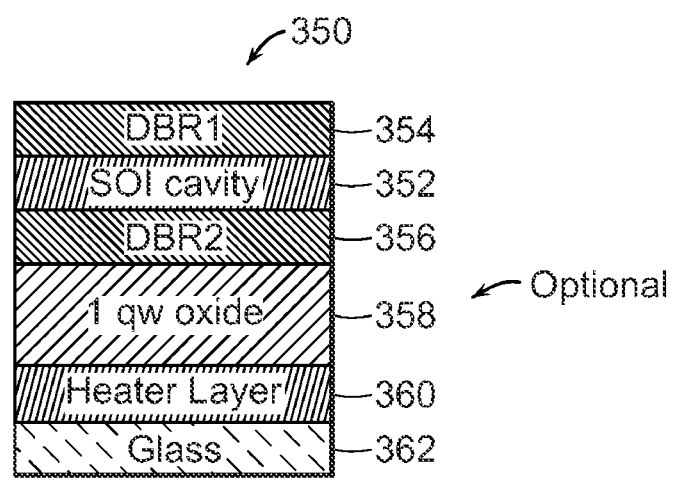
FIG. 3B illustrates another embodiment of a thermally tunable Fabry-Perot optical filter that can be used in the tunable laser of the present teaching.

FIG. 3B illustrates another embodiment of a thermally tunable Fabry-Perot optical filter 350 that can be used in the tunable laser of the present teaching. The tunable optical filter 350 is similar to the tunable optical filter 300 that was described in connection with FIG. 3A. In one embodiment, the tunable optical filter 350 includes a single-crystalline silicon cavity 352. However, one skilled in the art will appreciate that numerous types of Fabry-Perot cavities can be used. For example, the tunable optical filter 350 can include an amorphous silicon or various III-IV semiconductor material Fabry-Perot cavities. A first 354 and second distributed Bragg reflector 356 are positioned directly adjacent to the single-crystalline silicon cavity 352. The first distributed Bragg reflector 354 is formed on a top surface of the single-crystalline silicon cavity 352. The second distributed Bragg reflector 356 is formed on a bottom surface of the single-crystalline silicon cavity 352. In some embodiments, a quarter wavelength oxide layer 358 is formed on the bottom surface of the second distributed Bragg reflector 356 by fusion bonding two halves of the tunable optical filter 350. A single crystalline heater 360 is formed on the bottom of the quarter wavelength oxide layer 358. An electrical contact is made to the crystalline heater 360. A glass substrate 362 is bonded to the single crystalline heater 360.

The thermally tunable Fabry-Perot optical filters 300, 350 are highly reliable. One feature of the thermally tunable Fabry-Perot optical filters 300, 350 with single crystal cavities is that they have very low loss compared with amorphous silicon cavities in the wavelength ranges used for optical communications, such as 1550 nm. Another feature of the thermally tunable Fabry-Perot optical filters 300, 350 with single crystal cavities is that they have high thermal stability. Another feature of the thermally tunable Fabry-Perot optical filters 300, 350 with single crystal cavities is that they have a wide thermal tuning range due to their thermal stability. Yet another feature of the thermally tunable Fabry-Perot optical filters 300, 350 with single crystal cavities is that thicknesses of the single crystalline silicon cavities can be achieved over a much greater range compared with amorphous silicon and III-V semiconductor material cavities that are used in other optical filters.

There are many other possible configurations of the tunable laser according to the present teaching. Referring to FIG. 1, for example, the gain media 108 can be positioned away from the ends of the optical cavity 102. In such configurations, the use of both facets of the gain medium 108 enables the coupling of higher optical power into the optical fiber 120. Also, the frequency selective device 116 and the optical phase retarder 114 can be positioned in various positions in the optical cavity 102. In addition, the frequency selective device 116 and the optical phase retarder 114 can be separate or integrated devices.

Figure 4:
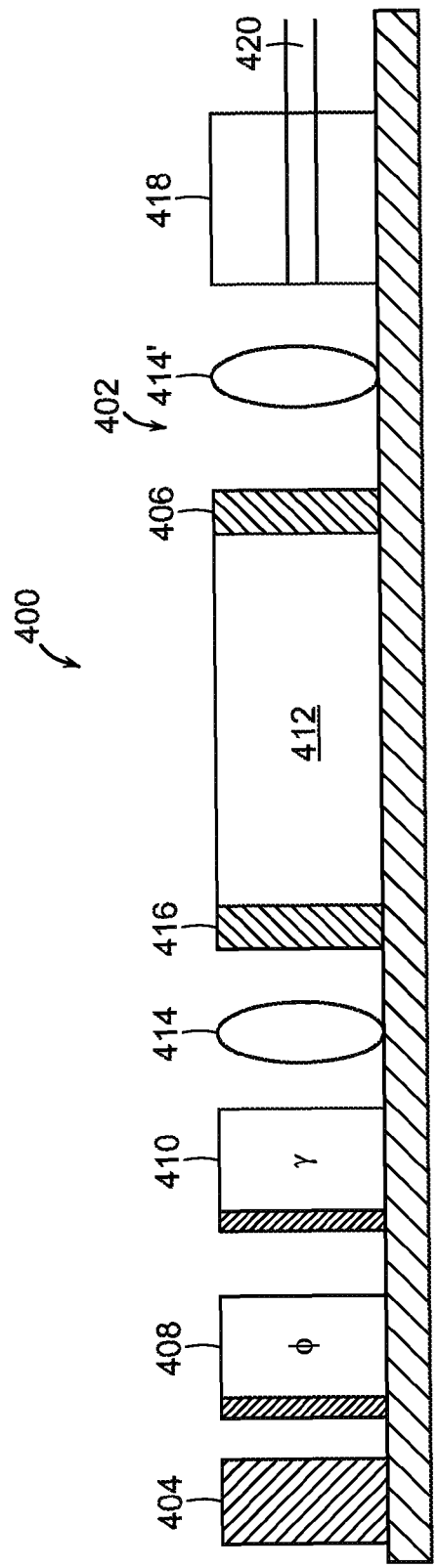
FIG. 4 illustrates another embodiment of a tunable laser according to the present invention.

FIG. 4 illustrates another embodiment of a tunable laser 400 according to the present invention. The tunable laser 400 is configured as a frequency-selective external optical cavity 402 that includes a discrete high-reflectivity mirror 404 at one end of the optical cavity 402 and a single partially reflecting laser facet 406 at the other end of the optical cavity 402. The tunable laser 400 includes an optical phase retarder 408 positioned adjacent to the high-reflectivity mirror 404. In one embodiment, the optical phase retarder 408 is a thermally-tunable phase retarder, such as a silicon chip positioned proximate to a resistive heater. The optical phase retarder 408 is used to adjust the optical cavity modes so that a cavity mode lines up directly with the desired optical frequency.

A frequency selective device 410, such as an optical filter, is positioned adjacent to the optical phase retarder 408. In one embodiment, the frequency selective device 410 is a thermally tunable optical filter. For example, the frequency selective device 410 can be a thermally tunable Fabry-Perot optical filter as described herein. In some embodiments, the frequency selective device 410 and the optical phase retarder 408 comprise an integrated temperature controlled phase retarder and thermally tunable optical filter. Also, in various embodiments, the positions of the frequency selective device 410 and the optical phase retarder 408 are interchanged.

The tunable laser 100 includes a semiconductor gain medium 412. Collimating lenses 414, 414' can be positioned adjacent to one or both ends of the semiconductor gain media 412 to focus the optical beam into and out of one or both sides of the semiconductor gain medium 412. One skilled in the art will appreciate that numerous other types of optical gain medium can also be used. An output of a current source is applied to the semiconductor gain medium 412 to provide power for generating the optical gain.

In one configuration according to the present teaching, the semiconductor gain medium 412 has an antireflection coating 416 on a first end surface positioned adjacent to the collimating lens 414 and the frequency selective device 410. The reflectivity of the partially reflecting laser facet 406 is chosen to provide the desired feedback into the optical cavity 402. An optical fiber collimating lens 418 is positioned adjacent to the partially reflecting laser facet 406 and the lens 414'. An input of an optical fiber 420 is positioned at the output of the collimating lens 414'. The collimating lens 414' focuses the light into the input of the optical fiber 420.

FIGS. 5A and 5B illustrate other embodiments of the tunable laser according to the present teaching that include an integrated frequency selective device and optical phase retarder for single and dual laser facet configurations. The control of the frequency selective device and optical phase retarder is done via separate heating elements located on the respective sides of the integrated element. There is some heat diffusion through the integrated element, so the control of the frequency selective device and optical phase retarder are somewhat coupled. However, for integrated elements with sufficient optical path length, the temperature difference across the integrated element may be sufficient to control both phase and frequency.

FIG. 5A illustrates an embodiment of the tunable laser according to the present teaching that is similar to the tunable laser 100 described in connection with FIG. 1. However, the tunable laser 500 includes an integrated frequency selective device and optical phase retarder 502 that includes a first heater 504 positioned at the end of the optical phase retarder section and a second heater 506 positioned at the end of the frequency selective device section of the integrated frequency selective device and optical phase retarder 502.

FIG. 5B illustrates an embodiment of the tunable laser according to the present teaching that is similar to the tunable laser 400 described in connection with FIG. 4. However, the tunable laser 550 includes an integrated frequency selective device and optical phase retarder 552 positioned between the high reflectivity mirror 404 and the lens 414. The first heater 554 is positioned at the end of the optical phase retarder section and a second heater 556 is positioned at the end of the frequency selective device section of the integrated frequency selective device and optical phase retarder 552.

Figure 6A:
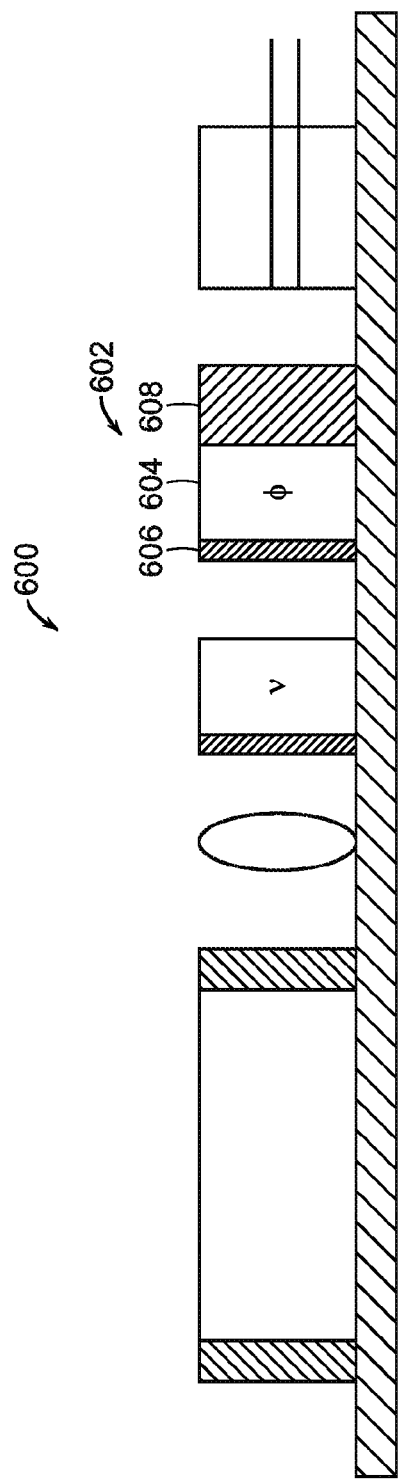
FIG. 6A illustrates another embodiment of the tunable laser according to the present teaching that is similar to the tunable laser described in connection with FIG. 1 but that includes an integrated optical phase retarder and a partially reflecting mirror in a single laser facet configuration.
Figure 6B:
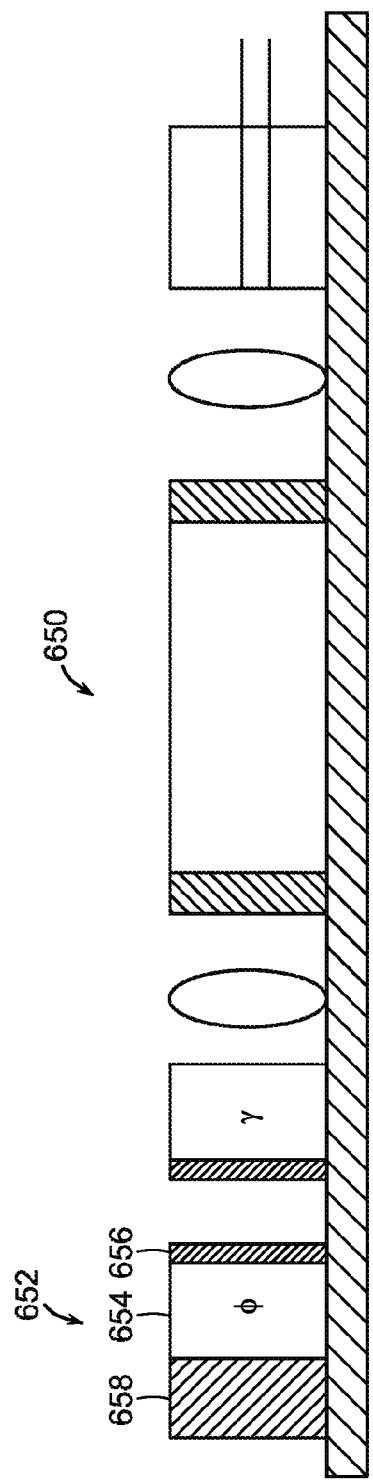
FIG. 6B illustrates another embodiment of the tunable laser according to the present teaching that is similar to the tunable laser described in connection with FIG. 4 but that includes an integrated optical phase retarder and a high reflectivity mirror in a dual laser facet configuration.

FIGS. 6A and 6B illustrate other embodiments of the tunable laser according to the present teaching that include an integrated phase retarder and mirror for single and dual laser facet configurations. The single laser facet configuration includes an integrated phase retarder and partially-reflecting mirror. The dual laser facet configuration includes an integrated phase retarder and high reflectivity mirror. The material used to form the mirrors can be chosen to be tolerant to temperature change provided by the heater.

FIG. 6A illustrates an embodiment of the tunable laser according to the present teaching that is similar to the tunable laser 100 described in connection with FIG. 1. However, the tunable laser 600 includes an integrated optical phase retarder and partially reflecting mirror 602 in a single laser facet configuration. The integrated device 602 includes an optical phase retarder section 604 with a heater 606 at one end and a partially reflecting mirror 608 at the other end.

FIG. 6B illustrates an embodiment of the tunable laser according to the present teaching that is similar to the tunable laser 400 described in connection with FIG. 4. However, the tunable laser 650 includes an integrated optical phase retarder and high reflectivity mirror 652 in a dual laser facet configuration. The integrated device 652 includes an optical phase retarder section 654 with a heater 656 at one end and a high reflectivity mirror 658 at the other end.

FIGS. 7A and 7B illustrate other embodiments of the tunable laser according to the present teaching that include an integrated gain medium and optical phase retarder for single and dual laser facet configurations. The optical phase retarder and gain medium are controlled by applying an electrical current to each section of the integrated device.

FIG. 7A illustrates an embodiment of the tunable laser according to the present teaching that is similar to the tunable laser 100 described in connection with FIG. 1. However, the tunable laser 700 includes an integrated optical phase retarder and gain medium 702 in a single laser facet configuration. The integrated device 702 includes an optical phase retarder section 704 with an antireflection coating 708 at one end and a gain medium 706 with a high reflectivity coating 710 at the other end.

FIG. 7B illustrates an embodiment of the tunable laser according to the present teaching that is similar to the tunable laser 400 described in connection with FIG. 4. However, the tunable laser 750 includes an integrated optical phase retarder and gain medium 752 in a dual laser facet configuration. The integrated device 752 includes an optical phase retarder section 754 with an antireflection coating 756 at one end and a gain medium 758 with an anti-reflection coating 760 at the other end.

Equivalents

While the applicants' teachings are described in conjunction with various embodiments, it is not intended that the applicant's teachings be limited to such embodiments. On the contrary, the applicants' teachings encompass various alternatives, modifications, and equivalents, as will be appreciated by those of skill in the art, which may be made therein without departing from the spirit and scope of the teachings.

What is claimed is:

1. A tunable laser comprising:
   a. an optical cavity comprising a first and second mirror;
   b. a gain medium positioned in the optical cavity;
   c. a thermally tunable optical filter comprising an integrated resistive heater positioned in the optical cavity, the thermally tunable optical filter being heated to a temperature that selects a desired optical mode of the optical cavity; and
   d. a thermally tunable optical phase retarder comprising an integrated resistive heater positioned in the optical cavity, the thermally tunable optical phase retarder being heated to a temperature that changes an optical path length in the optical cavity, independent of the physical cavity length, by an amount corresponding to a resonant frequency of the tunable optical filter so that a phase-matching condition of the optical cavity is shifted to the desired optical mode of the optical cavity selected by the thermally tunable optical filter.

2. The tunable laser of claim 1 wherein the gain medium positioned in the optical cavity comprises a semiconductor gain medium.

3. The tunable laser of claim 1 wherein the thermally tunable filter comprises a thermally tunable Fabry-Perot optical filter.

4. The tunable laser of claim 1 wherein the thermally tunable filter comprise a tunable Fabry-Perot optical filter comprising a single crystalline sheet resistance heater layer and distributed Bragg reflectors.

5. The tunable laser of claim 1 wherein at least one of the integrated resistive heater of the thermally tunable optical filter and the integrated resistive heater of the thermally tunable optical phase retarder comprises a single crystalline sheet resistive heater.

6. The tunable laser of claim 1 wherein the thermally tunable filter comprises a tuning range wide enough to selectively pass signals in an entire optical communications transmission band.

7. The tunable laser of claim 1 wherein the thermally tunable filter comprises a tuning range wide enough to selectively pass signals in one of the C- or L-bands.

8. The tunable laser of claim 1 wherein the thermally tunable filter comprises an integrated thermistor.

9. The tunable laser of claim 1 wherein the thermally tunable filter is selected from the group comprising a single-crystalline silicon cavity, an amorphous silicon cavity, and a III-IV semiconductor Fabry-Perot cavity.

10. The tunable laser of claim 1 wherein the thermally tunable filter device and the thermally tunable optical phase retarder are physically integrated into a single device.

11. The tunable laser of claim 1 wherein the thermally tunable optical phase retarder changes a phase by more than one-half of a wavelength of an optical beam propagating in the optical cavity.

12. A tunable laser comprising:
    a. an optical cavity comprising a mirror at one end and a laser facet at the other end;
    b. a semiconductor gain medium comprising the laser facet at one end and having an antireflection coating at the other end, the semiconductor gain medium being positioned in the optical cavity;
    c. a thermally tunable optical filter comprising an integrated resistive heater positioned in the optical cavity, the thermally tunable optical filter being heated to a temperature that selects a desired optical mode of the optical cavity; and
    d. a thermally tunable optical phase retarder comprising an integrated resistive heater positioned in the optical cavity, the thermally tunable optical phase retarder being heated to a temperature that changes an optical path length in the optical cavity, independent of the physical cavity length, by an amount corresponding to a resonant frequency of the tunable optical filter so that a phase-matching condition of the optical cavity is shifted to the desired optical mode of the optical cavity selected by the thermally tunable optical filter.

13. The tunable laser of claim 12 wherein the thermally tunable filter comprises a tunable Fabry-Perot optical filter comprising a single crystalline sheet resistance heater layer and distributed Bragg reflectors.

14. The tunable laser of claim 12 wherein the thermally tunable filter device and the thermally tunable optical phase retarder are physically integrated in a single device.

15. The tunable laser of claim 12 wherein at least one of the thermally tunable filter device and the thermally tunable optical phase retarder comprises an integrated thermistor.

16. A method of tuning a laser, the method comprising:
    a. forming an optical cavity comprising a first and second mirror;
    b. generating stimulated emission in the optical cavity;
    c. adjusting a temperature of a thermally tunable optical filter with an integrated resistive heater positioned in the optical cavity to select a desired optical mode of the optical cavity; and
    d. adjusting a temperature of a thermally tunable optical phase retarder comprising an integrated resistive heater positioned in the optical cavity to change an optical path length in the optical cavity, independent of the physical cavity length, by an amount corresponding to a resonant frequency of the tunable optical filter so that a phase-matching condition of the optical cavity is shifted to the desired optical mode of the optical cavity selected by the thermally tunable optical filter.

17. The method of claim 16 wherein the adjusting the temperature of the thermally tunable optical filter comprising applying a current to the integrative resistive heater of the thermally tunable optical filter.

18. The method of claim 16 wherein the adjusting the temperature of the thermally tunable optical phase retarder comprising applying a current to the integrative resistive heater of the thermally tunable optical phase retarder.

19. The method of claim 16 further comprising aligning at least one of the first mirror, the second mirror, the thermally tunable optical filter, and the thermally tunable optical phase retarder to improve performance.

20. The method of claim 16 further comprising measuring a temperature of the thermally tunable optical filter.

21. The method of claim 16 further comprising calibrating a filter response of the thermally tunable optical filter as a function of temperature.

22. The method of claim 16 further comprising measuring a temperature of the thermally tunable optical phase retarder.

23. The method of claim 16 further comprising calibrating a phase retardation response of the thermally tunable optical phase retarder as a function of temperature.

24. The method of claim 16 wherein the adjusting the temperature of the thermally tunable optical phase retarder changes a phase by more than one-half of a wavelength of an optical beam propagating in the optical cavity.

* * * * *